United States Patent
Iwamoto

(10) Patent No.: US 9,069,266 B2
(45) Date of Patent: *Jun. 30, 2015

(54) ALIGNMENT METHOD, ALIGNMENT APPARATUS, AND EXPOSURE APPARATUS

(75) Inventor: Takamitsu Iwamoto, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 756 days.

This patent is subject to a terminal disclaimer.

(21) Appl. No.: 13/339,118

(22) Filed: Dec. 28, 2011

(65) Prior Publication Data

US 2012/0170011 A1  Jul. 5, 2012

Related U.S. Application Data

(63) Continuation of application No. PCT/JP2010/060088, filed on Jun. 15, 2010.

(30) Foreign Application Priority Data

Jun. 29, 2009  (JP) ................................. 2009-153870

(51) Int. Cl.
*G03B 27/42* (2006.01)
*G03B 27/58* (2006.01)
(Continued)

(52) U.S. Cl.
CPC ........ *G03F 7/70791* (2013.01); *G03F 7/70775* (2013.01); *G03F 9/00* (2013.01); *G03F 9/7003* (2013.01)

(58) Field of Classification Search
CPC ............ G03F 7/70775; G03F 7/70791; G03F 7/70633; G03F 7/70666; G03F 7/70675; G03F 9/00; G03F 9/70; G03F 9/7003
USPC ............ 355/53, 55, 67–77, 78; 356/399–401; 430/5, 8, 22, 30, 311, 312, 394; 250/492.1, 492.2, 492.22, 548
See application file for complete search history.

(56) References Cited

U.S. PATENT DOCUMENTS 5,285,259 A * 2/1994 Saitoh .......................... 356/401
2009/0252422 A1  10/2009 Ogata et al.

FOREIGN PATENT DOCUMENTS

JP  2008-76709  4/2008
JP  2009-058698  3/2009
(Continued)

OTHER PUBLICATIONS

International Search Report from Japanese Patent Office for PCT/JP2010/060088, date of mailing Sep. 21, 2010.

*Primary Examiner* — Christina Riddle
(74) *Attorney, Agent, or Firm* — Finnegan, Henderson, Farabow, Garrett & Dunner, L.L.P.

(57) ABSTRACT

In the present invention, the number of brightness changes detected at the same position while a substrate moves by a certain distance is added up, a plurality of edge count data arranged corresponding to the detected positions of the brightness changes is obtained, a plurality of correlation value data by performing a correlation operation for the plurality of calculated edge count data while moving a template is obtained, positions of the plurality of patterns based on a plurality of correlation value data exceeding a predetermined threshold value are identified, a position of a pattern close to a target position of an imaging device is selected, and a photomask is moved in the direction substantially orthogonal to the conveying direction of the substrate so that the amount of the position displacement between the selected position of the pattern and the target position of the imaging device is a predetermined value.

11 Claims, 7 Drawing Sheets

(51) Int. Cl.
*G03B 27/62* (2006.01)
*G03B 27/32* (2006.01)
*G03F 7/20* (2006.01)
*G03F 9/00* (2006.01)
*G03B 27/52* (2006.01)

(56) References Cited

FOREIGN PATENT DOCUMENTS

WO    WO 2007/113933 A1    10/2007
WO    PCT/JP2010/060088    1/2012

* cited by examiner

→ A

FIG.6A
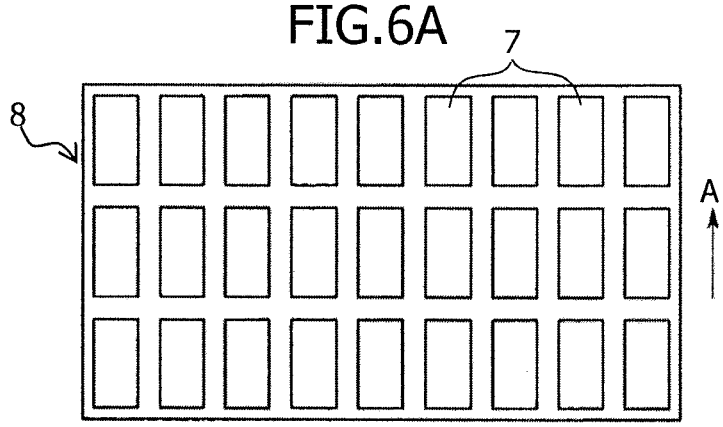
FIG.6B
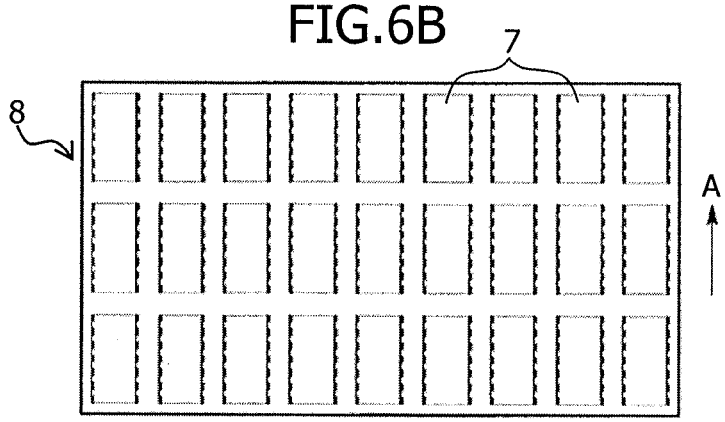
FIG.6D  FIG.6C
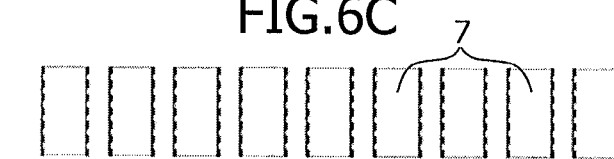
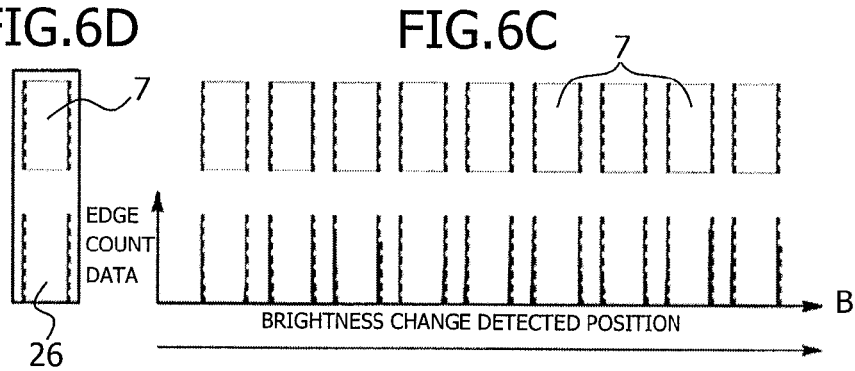
BRIGHTNESS CHANGE DETECTED POSITION
FIG.6E
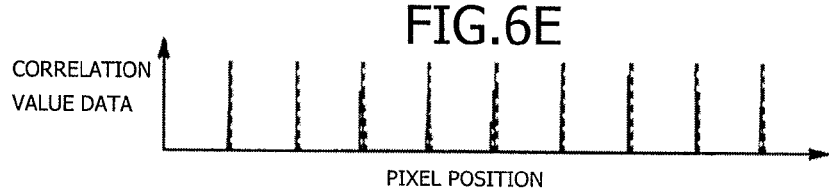
PIXEL POSITION
FIG.6F
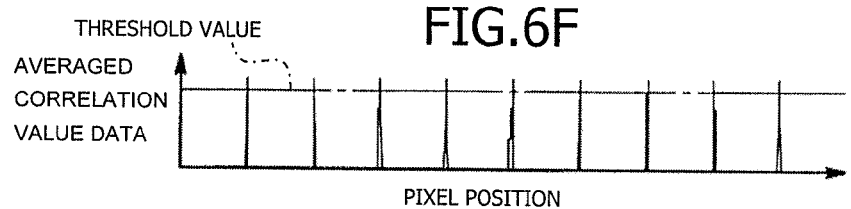
PIXEL POSITION

→ A

ALIGNMENT METHOD, ALIGNMENT APPARATUS, AND EXPOSURE APPARATUS

This application is a continuation of PCT/JP2010/060088, filed on Jun. 15, 2010.

BACKGROUND OF THE INVENTION

1. Field of the Invention

The present invention relates to an alignment method for aligning a photomask with an object to be exposed with uniform patterns arranged in a matrix and conveyed in a direction, and more specifically to an alignment method, an alignment apparatus, and an exposure apparatus capable of performing highly accurate alignment for a pattern having a complex shape.

2. Description of Related Art

In this type of conventional alignment method, an imaging device, which has a plurality of light receiving elements arranged in a straight line in a direction orthogonal to a conveying direction of a color filter substrate, captures an image of a plurality of rectangular pixels formed on a color filter substrate (an object to be exposed), detect the position of a left-side edge portion of a left-end pixel on the color filter substrate on the basis of brightness information of the captured image, calculate the amount of position displacement between the position of the left-side edge of the left-end pixel and the reference position (target position) preset in the imaging device, and move a photomask in the direction orthogonal to the conveying direction of the color filter substrate so as to correct the amount of the position displacement to thereby perform an alignment between the photomask and the color filter substrate (for example, refer to Japanese Laid-Open Patent Publication No. 2008-76709).

In the conventional alignment method, however, the position at which the brightness changes from dark to light is detected to perform the alignment between the patterns of the object to be exposed and openings of the photomask with reference to the positions. Therefore, for a pattern having a simple rectangular shape, it is easy to detect a reference position set on the edge of the pattern and further to perform the alignment. However, for a pattern having a complex shape such as a wiring pattern within a pixel such as, for example, a TFT substrate or a pattern having a complex outline shape obtained by epi-illumination, it is difficult to detect a reference position set on the edge portion of the pattern and further to perform the alignment. Accordingly, it is difficult to perform the alignment between the patterns of the object to be exposed and the openings of the photomask with high accuracy.

SUMMARY OF THE INVENTION

Therefore, in view of the above problem, it is an object of the present invention to provide an alignment method, an alignment apparatus, and an exposure apparatus capable of performing highly accurate alignment of a photomask for a pattern having a complex shape.

In order to achieve the above object, the alignment method according to the present invention is a method for aligning a photomask with an object to be exposed with uniform patterns arranged in a matrix and conveyed in a direction, the method including the steps of: sequentially processing a plurality of images captured at regular time intervals by an imaging device having the light receiving elements arranged in a straight line in a direction perpendicular to a conveying direction of the object to be exposed, thereby detecting positions of brightness changes in an arrangement direction of a plurality of light receiving elements; adding up, in the conveying direction of the object to be exposed, the number of brightness changes detected at the same position in the arrangement direction of the light receiving elements while the object to be exposed moves by a certain distance, thereby obtaining a plurality of edge count data arranged corresponding to the detected positions of the brightness changes; obtaining a plurality of correlation value data by performing a correlation operation for the plurality of calculated edge count data while moving a template, on which a unit edge count data is preset for a pattern having the same shape as the pattern, from one end to the other end in the arrangement direction of the plurality of calculated edge count data; identifying the positions of the plurality of patterns based on a plurality of correlation value data exceeding a predetermined threshold value in the plurality of correlation value data; selecting a position of a pattern close to a target position preset in the imaging device from the identified positions of the plurality of patterns; calculating the amount of position displacement between the selected position of the pattern and the target position of the imaging device; and relatively moving at least the photomask in the direction perpendicular to the conveying direction of the object to be exposed so that the amount of the position displacement is a predetermined value to perform alignment between the photomask and the object to be exposed.

According to this configuration, the positions of brightness changes in the arrangement direction of the plurality of light receiving elements are detected by sequentially processing a plurality of images captured at regular time intervals by the imaging device having the light receiving elements arranged in the straight line in the direction perpendicular to the conveying direction of the object to be exposed while conveying the object to be exposed with uniform patterns arranged in the matrix, the number of brightness changes detected at the same position in the arrangement direction of the light receiving elements is added up in the conveying direction of the object to be exposed while the object to be exposed moves by a certain distance, a plurality of edge count data arranged corresponding to the detected positions of the brightness changes are obtained, a plurality of correlation value data is obtained by performing a correlation operation for the plurality of calculated edge count data while moving a template, on which a unit edge count data is preset for a pattern having the same shape as the pattern, from one end to the other end in the arrangement direction of the plurality of calculated edge count data, the positions of the plurality of patterns are identified based on a plurality of correlation value data exceeding a predetermined threshold value in the plurality of correlation value data, the position of a pattern close to a target position preset in the imaging device is selected from the identified positions of the plurality of patterns, the amount of a position displacement between the selected position of the pattern and the target position of the imaging device is calculated, and at least the photomask is relatively moved in the direction perpendicular to the conveying direction of the object to be exposed so that the amount of the position displacement is a predetermined value to perform alignment between the photomask and the object to be exposed.

Preferably, after identifying the positions of the plurality of patterns, instead of the step of selecting the position of the pattern close to the target position preset in the imaging device, the alignment method includes the steps of: calculating midpoint positions of proximity pairs of the plurality of patterns; and selecting a midpoint position close to the target position preset in the imaging device from the plurality of midpoint positions. In the step of calculating the amount of the position displacement, the amount of a position displacement between the selected midpoint position and the target position of the imaging device is calculated.

Preferably, the step of detecting the positions of brightness changes includes detecting the positions of brightness changes from light to dark and dark to light, the step of obtaining the plurality of edge count data includes obtaining respective edge count data by adding up the number of brightness changes from light to dark and dark to light respectively, the step of obtaining the plurality of correlation value data includes finding a plurality of correlation value data corresponding to the brightness changes from light to dark and a plurality of correlation value data corresponding to the brightness changes from dark to light by performing a correlation operation for the calculated respective edge count data and then obtaining an averaged correlation value data by averaging the proximity pairs in the plurality of correlation value data, and the step of identifying the positions of the plurality of patterns includes identifying the positions of the plurality of patterns based on the plurality of correlation value data exceeding the preset threshold value in the averaged correlation value data.

Preferably, the imaging device captures an image of the patterns of the object to be exposed using epi-illumination.

Preferably, the object to be exposed is a TFT substrate on which a wiring pattern is formed.

Moreover, an alignment apparatus according to the present invention aligns a photomask with an object to be exposed with uniform patterns arranged in a matrix and conveyed in a direction, the apparatus including: an image processing section which detects the positions of brightness changes in an arrangement direction of a plurality of light receiving elements by sequentially processing a plurality of images captured at regular time intervals by an imaging device having the light receiving elements arranged in a straight line in a direction perpendicular to a conveying direction of the object to be exposed, adds up, in the conveying direction of the object to be exposed, the number of brightness changes detected at the same position in the arrangement direction of the light receiving elements while the object to be exposed moves by a certain distance, obtains a plurality of edge count data arranged corresponding to the detected positions of the brightness changes, obtains a plurality of correlation value data by performing a correlation operation for the plurality of calculated edge count data while moving a template, on which a unit edge count data is preset for a pattern having the same shape as the pattern, from one end to the other end in the arrangement direction of the plurality of calculated edge count data, and identifies the positions of the plurality of patterns based on a plurality of correlation value data exceeding a preset threshold value in the plurality of correlation value data; an arithmetic section which selects the position of a pattern close to a target position preset in the imaging device from the identified positions of the plurality of patterns and calculates the amount of position displacement between the selected position of the pattern and the target position of the imaging device; and an alignment apparatus which relatively moves at least the photomask in the direction perpendicular to the conveying direction of the object to be exposed so that the amount of the position displacement is a preset value to perform alignment between the photomask and the object to be exposed.

According to this configuration, the image processing section sequentially processes a plurality of images captured at regular time intervals by the imaging device having the plurality of light receiving elements arranged in the straight line in the direction perpendicular to the conveying direction of the object to be exposed with uniform patterns arranged in the matrix and conveyed in the direction to detect the positions of brightness changes in the arrangement direction of the light receiving elements, adds up, in the conveying direction of the object to be exposed, the number of brightness changes detected at the same position in the arrangement direction of the light receiving elements while the object to be exposed moves by a certain distance, obtains the plurality of edge count data arranged corresponding to the detected positions of the brightness changes, obtains the plurality of correlation value data by performing the correlation operation for the plurality of calculated edge count data while moving the template, on which the unit edge count data is preset for a pattern having the same shape as the pattern, from one end to the other end in the arrangement direction of the plurality of calculated edge count data, and identifies the positions of the plurality of patterns based on a plurality of correlation value data exceeding a preset threshold value in the plurality of correlation value data, an arithmetic section selects the position of a pattern close to a target position preset in the imaging device from the identified positions of the plurality of patterns and calculates the amount of position displacement between the selected position of the pattern and the target position of the imaging device, and an alignment mechanism relatively moves at least the photomask in the direction perpendicular to the conveying direction of the object to be exposed so that the amount of the position displacement is a preset value to perform alignment between the photomask and the object to be exposed.

Preferably, the arithmetic section calculates midpoint positions of proximity pairs of the plurality of identified patterns, selects a midpoint position close to the target position preset in the imaging device from the plurality of midpoint positions, and calculates the amount of a position displacement between the selected midpoint position and the target position of the imaging device.

Preferably, the image processing section detects the positions of brightness changes from light to dark and dark to light, obtains respective edge count data by adding up the number of brightness changes from light to dark and dark to light respectively, finds a plurality of correlation value data corresponding to the brightness changes from light to dark and a plurality of correlation value data corresponding to the brightness changes from dark to light by performing a correlation operation for the calculated respective edge count data, obtains an averaged correlation value data by averaging the proximity pairs in the plurality of correlation value data, and then identifies the positions of the plurality of patterns from the correlation value data exceeding the predetermined threshold value in the averaged correlation value data.

Furthermore, an exposure apparatus according to the present invention exposes an object to be exposed with uniform patterns arranged in a matrix and conveyed in a direction with a photomask aligned with the object to be exposed, the apparatus including: a light source which emits an ultraviolet light; a mask stage which holds the photomask so as to be opposite to and close to a surface of the object to be exposed that is being conveyed; an imaging device which has a plurality of light receiving elements arranged in a straight line in a direction perpendicular to a conveying direction of the object to be exposed and captures an image of an object at a position apart a certain distance in the opposite direction of the conveying direction of the exposure position with the photomask; and an alignment apparatus which detects the positions of brightness changes in an arrangement direction of the light receiving elements by sequentially processing a plurality of images captured at regular time intervals by the imaging device, adds up, in the conveying direction of the object to be exposed, the number of brightness changes detected at the same position in the arrangement direction of the light receiving elements while the object to be exposed moves by a certain distance, obtains a plurality of edge count data arranged corresponding to the detected positions of the brightness changes, obtains a plurality of correlation value data by performing a correlation operation for the plurality of calculated edge count data while moving a template, on which a unit edge count data is preset for a pattern having the same shape as the pattern, from one end to the other end in the arrangement direction of the plurality of calculated edge count data, and identifies the positions of the plurality of patterns based on a plurality of correlation value data exceeding a predetermined threshold value in the plurality of correlation value data, selects the position of a pattern close to a target position preset in the imaging device from the identified positions of the plurality of patterns, calculates the amount of position displacement between the selected position of the pattern and the target position of the imaging device, and relatively moves at least the mask stage in the direction perpendicular to the conveying direction of the object to be exposed so that the amount of the position displacement is a predetermined value to perform alignment between the photomask and the object to be exposed.

According to this configuration, the alignment apparatus sequentially processes a plurality of images captured at regular time intervals by the imaging device having the plurality of light receiving elements arranged in the straight line in the direction perpendicular to the conveying direction of the object to be exposed with uniform patterns arranged in the matrix while conveying the object to be exposed in the direction to detect the positions of brightness changes in the arrangement direction of the light receiving elements, adds up, in the conveying direction of the object to be exposed, the number of brightness changes detected at the same position in the arrangement direction of the light receiving elements while the object to be exposed moves by a certain distance, obtains a plurality of edge count data arranged corresponding to the detected positions of the brightness changes, obtains a plurality of correlation value data by performing a correlation operation for the plurality of calculated edge count data while moving a template, on which a unit edge count data is preset for a pattern having the same shape as the pattern, from one end to the other end in the arrangement direction of the plurality of calculated edge count data, and identifies the positions of the plurality of patterns from a plurality of correlation value data exceeding a predetermined threshold value in the plurality of correlation value data, selects the position of a pattern close to a target position preset in the imaging device from the identified positions of the plurality of patterns, calculates the amount of position displacement between the selected position of the pattern and the target position of the imaging device, and relatively moves at least the mask stage, which holds the photomask so as to be opposite to and close to a surface of the object to be exposed under conveyance, in the direction perpendicular to the conveying direction of the object to be exposed so that the amount of the position displacement is a preset value to perform alignment between the photomask and the object to be exposed, and then a light source emits an ultraviolet light to expose the object to be exposed.

Preferably, the alignment apparatus identifies the positions of the plurality of patterns, calculates the midpoint positions of proximity pairs of the plurality of patterns, selects a midpoint position close to the target position preset in the imaging device from the plurality of midpoint positions, and calculates the amount of position displacement between the selected midpoint position and the target position of the imaging device.

Preferably, the alignment apparatus detects the positions of brightness changes from light to dark and dark to light, obtains respective edge count data by adding up the number of brightness changes from light to dark and dark to light respectively, finds a plurality of correlation value data corresponding to the brightness changes from light to dark and a plurality of correlation value data corresponding to the brightness changes from dark to light by performing a correlation operation for the calculated respective edge count data, obtains an averaged correlation value data by averaging the proximity pairs in the plurality of correlation value data, and then identifies the positions of the plurality of patterns based on the plurality of correlation value data exceeding the preset threshold value in the averaged correlation value data.

According to the invention of a first or sixth aspect, even in the case in which the patterns formed on the object to be exposed each have a complex shape or in which each pattern has a complex outline shape as obtained under epi-illumination, it is possible to easily detect the positions of the plurality of patterns arranged in the direction perpendicular to the conveying direction of the object to be exposed by sequentially processing the captured images on the object to be exposed being conveyed. Therefore, it is possible to cause the photomask to follow the movement of the object to be exposed conveyed while being swayed in the direction perpendicular to the conveying direction with reference to the detected positions of the patterns, thereby enabling the openings of the photomask to be aligned with the patterns of the object to be exposed with high accuracy. Moreover, the invention enables reduction of a circuit size in comparison with a pattern matching method for a two-dimensional image and enables fast image processing. Therefore, the takt time for the exposure process can be reduced.

Furthermore, according to the invention of a second, seventh or tenth aspect, the midpoint positions of proximity pairs of the plurality of identified patterns can be detected and alignment between the object to be exposed and the photomask can be performed with reference to the midpoint position.

Still further, according to the invention of a third, eighth or eleventh aspect, the positions of the patterns can be identified more accurately. This enables the accuracy of the alignment between the object to be exposed and the photomask to be further enhanced.

Moreover, according to the invention of a fourth aspect, the positions of the patterns of the object to be exposed made of an opaque substrate can be easily detected.

Furthermore, according to the invention of a fifth aspect, the openings of the photomask can be accurately aligned even with a TFT substrate having a wiring pattern within a pixel.

According to the invention of a ninth aspect, even in the case in which the patterns formed on the object to be exposed each have a complex shape, it is possible to easily detect the positions of the plurality of patterns arranged in the direction perpendicular to the conveying direction of the object to be exposed by sequentially processing the captured images on the object to be exposed being conveyed. Therefore, it is possible to cause the photomask to follow the movement of the object to be exposed conveyed while being swayed in the direction perpendicular to the conveying direction with reference to the detected positions of the patterns, thereby enabling the openings of the photomask to be aligned with the patterns of the object to be exposed with high accuracy for exposure. Moreover, the invention enables reduction of a circuit size in comparison with a pattern matching method for a two-dimensional image and enables fast image processing. Therefore, the takt time for the exposure process can be reduced.

BRIEF DESCRIPTION OF THE DRAWINGS

FIGS. 6A to 6F are an explanatory diagram illustrating the alignment method according to the present invention: FIG. 6A illustrates an epi-illumination image of the color filter substrate; FIG. 6B illustrates a result of detecting edge portions of pixels parallel to the conveying direction on the color filter substrate in FIG. 6A; FIG. 6C illustrates edge count data corresponding to the pixel row at the top; FIG. 6D illustrates a template made of unit edge count data corresponding to the pixels at the top; FIG. 6E illustrates correlation value data obtained by correlation comparison of FIG. 6D with FIG. 6C; and FIG. 6F illustrates averaged correlation value data obtained by averaging proximity pairs in the correlation value data of FIG. 6E.

DESCRIPTION OF THE PREFERRED EMBODIMENTS

Figure 1:
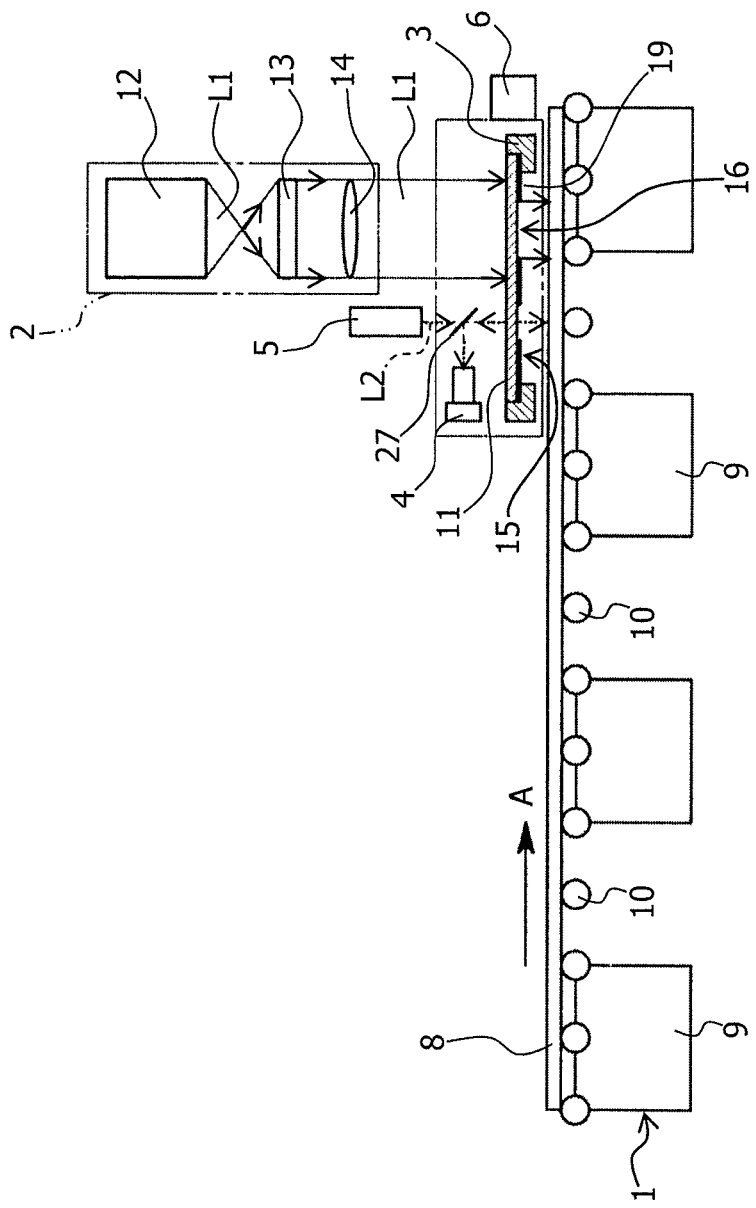
FIG. 1 is a front view illustrating an embodiment of an exposure apparatus according to the present invention.

Hereinafter, preferred embodiments of the present invention will be described in detail on the basis of appended drawings. FIG. 1 is a front view illustrating an embodiment of an exposure apparatus according to the present invention. The exposure apparatus exposes an object to be exposed with uniform patterns arranged in a matrix and being conveyed in a direction with a photomask aligned with the object to be exposed. The exposure apparatus includes a conveying device 1, an exposure optical system 2, a mask stage 3, an imaging device 4, an illumination light source 5, and an alignment apparatus 6.

Figure 2:
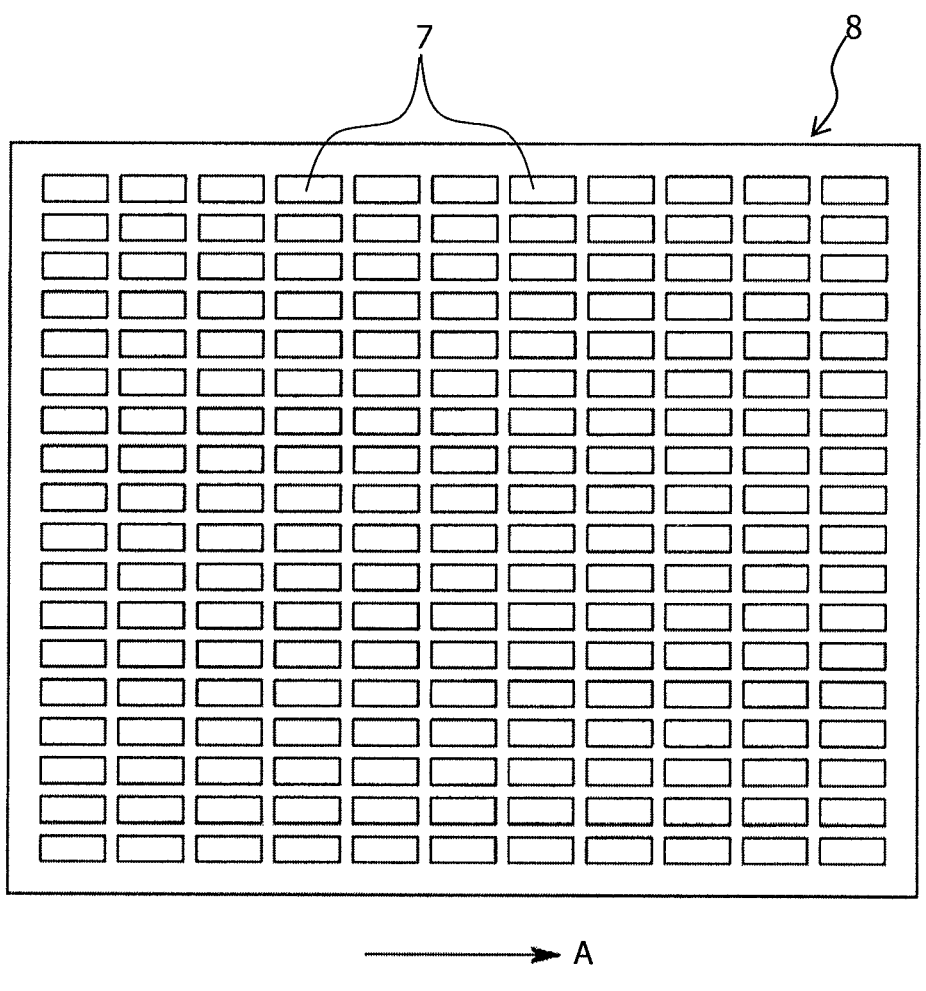
FIG. 2 is a plan view illustrating a color filter substrate used in the above embodiment.

This specification describes a case in which, as illustrated in FIG. 2, for example, the object to be exposed is a color filter substrate 8, in which rectangular pixels 7 (patterns) on a black matrix are formed in a matrix, and is conveyed in the arrow A direction as illustrated in FIG. 2.

The above conveying device 1 conveys the color filter substrate 8 placed on the top thereof in the arrow A direction in FIG. 1, with a plurality of unit stages 9, each having a plurality of ejection holes for ejecting gas and a plurality of suction holes for sucking gas on the top surface, being arranged in parallel in the conveying direction (hereinafter, referred to as "substrate conveying direction") of the color filter substrate 8. The conveying device 1 conveys the color filter substrate 8 with both end edge portions of the color filter substrate 8 supported by conveying rollers 10 in a state in which the color filter substrate 8 is spaced a given amount from and over the plurality of unit stages 9 with a balance maintained between the ejection and suction of the gas.

The exposure optical system 2 is provided above the aforementioned conveying device 1. The exposure optical system 2 irradiates a photomask 11 described later with a uniform light source light L1 and includes an exposure light source 12, a photo integrator 13, and a condenser lens 14 in this order from the upstream to the downstream of an optical path.

Here, the exposure light source 12 emits an ultraviolet light and is a laser oscillator, a Xenon flash lamp, or the like. In addition, the photo integrator 13 provides uniform brightness distribution within the cross section of the light source light L1 emitted from the exposure light source 12 and is a fly-eye lens, a rod lens, a light pipe, or the like. Furthermore, the condenser lens 14 causes the light source light L1 to be parallel light to irradiate the photomask 11 with the parallel light.

The mask stage 3 is provided between the conveying device 1 and the exposure optical system 2. This mask stage 3 is parallel to the surface of the color filter substrate 8 being conveyed and holds the photomask 11 so as to be opposite to and close to the surface of the color filter substrate 8, having an aperture 15 formed in the central part thereof to hold the edge portions of the photomask 11.

Figure 3:
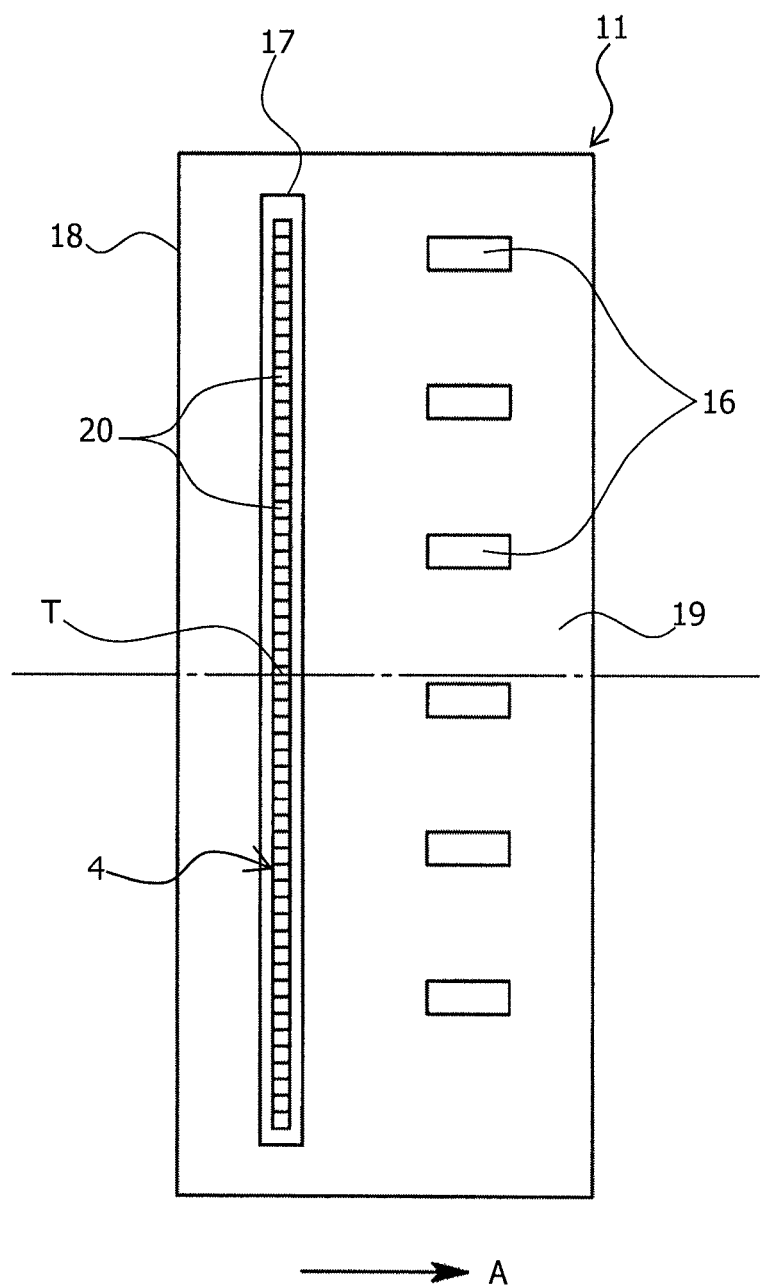
FIG. 3 is a plan view illustrating a photomask used in the above embodiment and an explanatory diagram illustrating a positional relationship between mask patterns and an imaging device.

As illustrated in FIG. 3, the aforementioned photomask 11 is formed by arranging a plurality of openings (hereinafter, the opening is referred to as "mask pattern 16"), each of which has substantially the same shape as the aforementioned pixel 7, so as to have a given positional relationship with the center line parallel to the arrow A (the substrate conveying direction) and the plurality of openings are arranged with a pitch three times as large as the arrangement pitch of the pixels 7 in a direction perpendicular (orthogonal) to the arrow A in FIG. 2. Moreover, a narrow and long observation window 17 is formed lateral to the row of the mask patterns 16 so as to be a certain distance apart from and in parallel to the row of the mask patterns 16, so that an imaging device 4 described later is able to capture the image of the surface of the color filter substrate 8 through the observation window 17. Furthermore, as illustrated in FIG. 3, the photomask 11 is held by the mask stage 3 so that the side of the row of the mask patterns 16 corresponds to the front side of the substrate conveying direction indicated by the arrow A. In this embodiment, the width of the mask pattern 16 in a direction perpendicular to the substrate conveying direction (the arrow A direction) is formed equal to the arrangement pitch of the pixels 7 in the same direction.

More specifically, the photomask 11 is made by forming a light-shielding film 19 of chrome (Cr) over a surface of a transparent glass substrate 18 and then forming the mask patterns 16 and the observation window 17 on the light-shielding film 19. On the other surface of the glass substrate 18, an anti-reflection film is formed so as to correspond to the row of the mask patterns 16 and a filter film transmitting a visible light and reflecting an ultraviolet light is formed so as to correspond to the observation window 17. Then, as illustrated in FIG. 1, the photomask 11 is held by the mask stage 3 with the surface on which the light-shielding film 19 is formed facing downward.

The imaging device 4 is provided above the conveying device 1. The imaging device 4 captures the image of the plurality of pixels 7 formed on the color filter substrate 8 at a position spaced apart a certain distance in the opposite direction of the substrate conveying direction from an exposure position of the photomask 11 and, as illustrated in FIG. 3, the imaging device 4 is a line CCD (sensor) having a plurality of light receiving elements 20 arranged in a straight line in the direction perpendicular to the substrate conveying direction (the arrow A direction). In addition, a target position T, which is to be a target of the alignment between the color filter substrate 8 and the photomask 11, is preset in a predetermined position (the center position in FIG. 3) of the line-shaped light receiving unit. Furthermore, in this embodiment, the imaging device 4 is disposed with the target position T matching the center line of the photomask 11, which is parallel to the substrate conveying direction indicated by the arrow A as illustrated in FIG. 3.

An illumination light source 5 is provided on an optical path, which is branched from the optical path extending from the conveying device 1 toward the imaging device 4 by a half mirror 27. The illumination light source 5 irradiates the color filter substrate 8 with the illumination light L2 through the observation window 17 of the photomask 11 so as to enable the imaging device 4 to capture the image of the pixels 7 of the color filter substrate 8 by using the reflected light on the color filter substrate 8, and the illumination light source 5 is a halogen lamp or the like mainly emitting a visible light.

Figure 4:
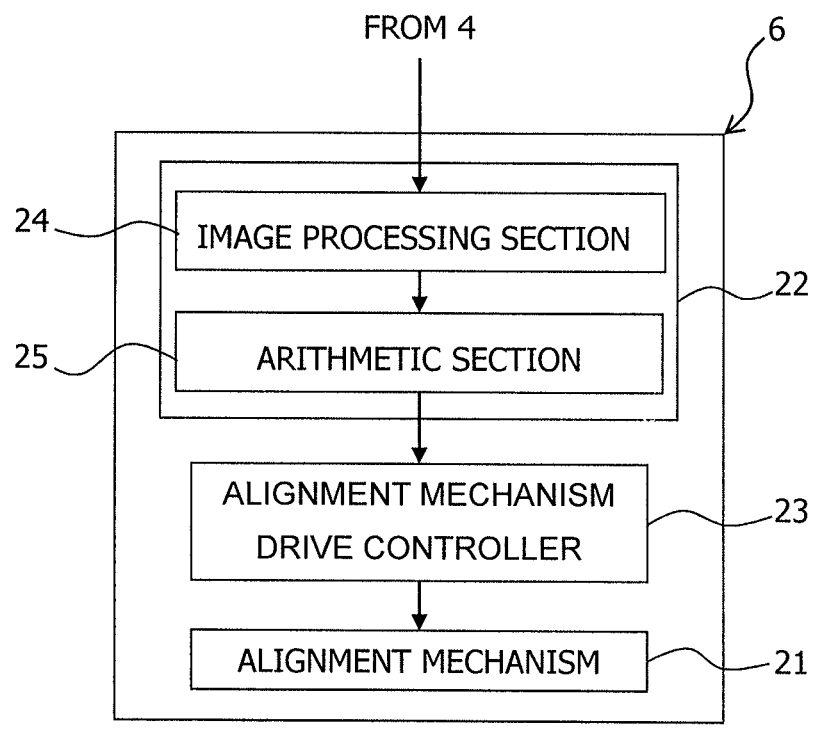
FIG. 4 is a block diagram illustrating an embodiment of an alignment apparatus according to the present invention.

An alignment apparatus 6 is provided in such a way that the mask stage 3 and the imaging device 4 are integrally movable in the direction perpendicular to the substrate conveying direction within the plane parallel to the surface of the color filter substrate 8. The alignment apparatus 6 detects the positions of brightness changes from light to dark and dark to light in the arrangement direction of the light receiving elements 20 of the imaging device 4 by sequentially processing a plurality of one-dimensional images captured at regular time intervals by the imaging device 4, obtains a plurality of edge count data (See FIG. 6C) corresponding to the positions of the brightness changes from light to dark and dark to light by adding up, in the substrate conveying direction, the number of brightness changes detected at the same position in the arrangement direction of the light receiving elements 20 while the color filter substrate 8 moves by a certain distance (See FIG. 6C), finds a plurality of first correlation value data (See the solid line of FIG. 6E) corresponding to the brightness changes from light to dark by performing a correlation operation for the plurality of calculated edge count data while moving a template 26 (See FIG. 6D), on which the unit edge count data is preset for the pattern having the same shape as the pixel 7 of the color filter substrate 8, from one end to the other end in the arrangement direction of the plurality of calculated edge count data, at the same time, finds a plurality of second correlation value data (See the dashed line of FIG. 6E) corresponding to the brightness changes from dark to light, obtains the averaged correlation value data (See FIG. 6F) by averaging proximity pairs in the plurality of first and second correlation value data, identifies the positions of the plurality of pixels 7 based on the plurality of correlation value data exceeding a predetermined threshold value in the averaged correlation value data, calculates the midpoint positions of the proximity pairs of the plurality of identified pixels 7, selects a midpoint position close to the target position T preset in the imaging device 4 from the plurality of midpoint positions, calculates the amount of the position displacement between the selected midpoint position and the target position T of the imaging device 4, and moves the photomask 11 in the direction perpendicular to the substrate conveying direction so that the amount of the position displacement is the predetermined value to perform alignment between the photomask 11 and the color filter substrate 8. As illustrated in FIG. 4, the alignment apparatus 6 includes an alignment mechanism 21, a position displacement amount detection section 22, and an alignment mechanism drive controller 23. In this embodiment, the width of the mask pattern 16 of the photomask 11 in the direction perpendicular to the substrate conveying direction is formed equal to the arrangement pitch of the pixels 7 in the same direction. Therefore, the aforementioned alignment causes each of both end edge portions of the mask pattern 16 parallel to the substrate conveying direction (the arrow A direction) to be located in the intermediate position between the pixels 7 adjacent to each other.

Here, the alignment mechanism 21 integrally moves the mask stage 3 and the imaging device 4 in the direction perpendicular to the substrate conveying direction within the plane parallel to the surface of the color filter substrate 8 and the alignment mechanism 21 includes, for example, a motor and a slide stage. Moreover, the position displacement amount detection section 22 processes the images captured by the imaging device 4 and calculates the amount of the position displacement between the photomask 11 and the color filter substrate 8. As illustrated in FIG. 4, the position displacement amount detection section 22 includes an image processing section 24 and an arithmetic section 25 constituted by the CPU. In this case, the image processing section 24 has functions of detecting the positions of brightness changes from light to dark and dark to light in the arrangement direction of the light receiving elements 20 of the imaging device 4 by sequentially processing a plurality of images captured at regular time intervals by the imaging device 4, obtaining a plurality of edge count data (the data is not the number of added edges obtained while the imaging device 4 imports one line of data) corresponding to the positions of the brightness changes from light to dark and dark to light by adding up, in the substrate conveying direction, the number of brightness changes detected at the same position in the arrangement direction of the light receiving elements 20 while the color filter substrate 8 moves by a certain distance, finding a plurality of first correlation value data corresponding to the brightness changes from light to dark by performing a correlation operation for the plurality of calculated edge count data while moving the template 26, on which the unit edge count data is preset for the pattern having the same shape as the pixel 7 of the color filter substrate 8, from one end to the other end in the arrangement direction of the plurality of calculated edge count data and, at the same time, finding a plurality of second correlation value data corresponding to the brightness changes from dark to light, obtaining the averaged correlation value data by averaging proximity pairs in the plurality of first and second correlation value data, and further identifying the positions of the plurality of pixels 7 based on the plurality of correlation value data exceeding a predetermined threshold value in the averaged correlation value data. Moreover, the arithmetic section 25 has functions of calculating the midpoint positions of the proximity pairs of the plurality of pixels 7 identified by the image processing section 24, selecting a midpoint position close to the target position T preset in the imaging device 4 from the plurality of midpoint positions, and calculating the amount of the position displacement between the selected midpoint position and the target position T of the imaging device 4, and the arithmetic processing is performed using software. Furthermore, the alignment mechanism drive controller 23 controls the drive of the motor of the alignment mechanism 21 to move the mask stage 3 and the imaging device 4 integrally so that the amount of the position displacement calculated by the arithmetic section 25 is a predetermined value.

Figure 5:
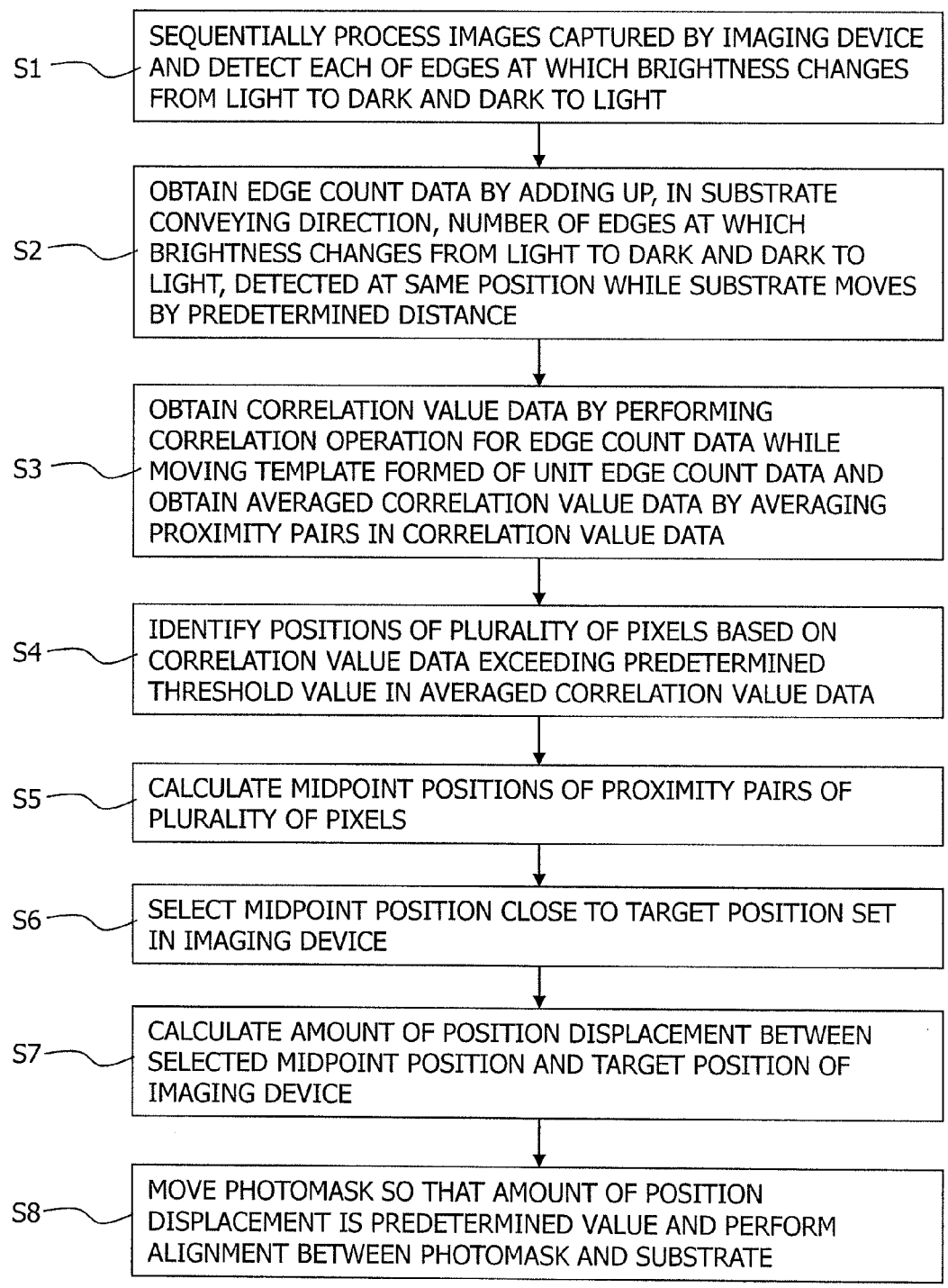
FIG. 5 is a flowchart illustrating an alignment method according to the present invention.

The following describes the operation of the exposure apparatus having the above-mentioned configuration and an alignment method of the present invention with reference to the flowchart of FIG. 5. First, the color filter substrate 8 coated with a predetermined color resist is positioned and placed at a given position on the conveying device 1 and then conveyed at a constant speed in the arrow A direction illustrated in FIG. 1.

At the time when the front side of the color filter substrate 8 in the substrate conveying direction reaches the imaging position of the imaging device 4, the imaging device 4 starts image capturing. At this time, the color filter substrate 8 is irradiated with the illumination light L2 of the illumination light source 5 through the observation window 17 of the photomask 11 and the imaging device 4 receives the illumination light L2 reflected on the color filter substrate 8. This causes the imaging device 4 to capture a one-dimensional image of the plurality of pixels 7 formed on the color filter substrate 8 in the direction perpendicular to the substrate conveying direction (the arrow A). The image capturing by the imaging device 4 is performed every time the color filter substrate 8 moves by a distance substantially equal to the width of the light receiving element 20 in the substrate conveying direction (the arrow A direction illustrated in FIG. 3). Note that the image captured under epi-illumination as described above has outline shapes with the edges of the pixels 7 black-rimmed as illustrated in FIG. 6A.

Here, first, in step S1, the image processing section 24 sequentially processes the images captured at regular time intervals by the imaging device 4 and detects each of the plurality of edges of the pixels 7 on the color filter substrate 8 at which the brightness changes from light to dark (See the solid line of FIG. 6B) and the plurality of edges at which the brightness changes from dark to light (See the dashed line of FIG. 6B) in the direction perpendicular to the substrate conveying direction.

In step S2, the exposure apparatus obtains the plurality of edge count data (See the solid line of FIG. 6C) arranged corresponding to the detected positions of the brightness changes by adding up, in the substrate conveying direction, the number of brightness changes from light to dark, which are detected at the same position in the arrangement direction of the light receiving element 20 of the imaging device 4 while the color filter substrate 8 moves by the same distance as the arrangement pitch of the pixels 7 in the substrate conveying direction, and obtains the plurality of edge count data (See the dashed line of FIG. 6C) arranged corresponding to the detected positions of the brightness changes by adding up, in the substrate conveying direction, the number of brightness changes from dark to light.

In step S3, the exposure apparatus performs a correlation operation for the plurality of calculated edge count data while moving the template 26 (See FIG. 6D) on which the unit edge count data is preset for the pattern having the same shape as the pixel 7 of the color filter substrate 8 from one end toward the other end in the arrangement direction of the plurality of calculated edge count data (See the arrow B of FIG. 6C) to find the plurality of first correlation value data (See the solid line of FIG. 6E) corresponding to the brightness changes from light to dark and at the same time to find the plurality of second correlation value data (See the dashed line of FIG. 6E) corresponding to the brightness changes from dark to light. At this time, a plurality of first pixel positions in the arrow B direction of FIG. 6C can be identified on the basis of the plurality of first correlation value data, and a plurality of second pixel positions can be identified on the basis of the plurality of second correlation value data. Here, the coordinates of the center of the template 26 are set so as to match the center of the pixel 7 illustrated in the upper stage of FIG. 6D. Therefore, the first correlation value data and the second correlation value data appear in the center position of each pixel 7 being matched with each other by definition. Actually, however, the first correlation value data and the second correlation value data sometimes do not match each other as illustrated in FIG. 6E due to the detection accuracy of the light receiving elements 20 of the imaging device 4. Accordingly, in this embodiment, proximity pairs are averaged in the first and second correlation value data to obtain averaged correlation value data in order to further enhance the identification accuracy of the positions of the pixels 7 (See FIG. 6F).

In step S4, the positions of the plurality of pixels 7 are identified based on a plurality of correlation value data exceeding a predetermined threshold value in the averaged correlation value data obtained in step S3 (See FIG. 6F).

In step S5, the midpoint positions of the proximity pairs of the plurality of pixels 7 identified in step S4 are calculated. In this case, the midpoint position corresponds to the center position on the black matrix between the pixels 7 adjacent to each other.

In step S6, a midpoint position close to the target position T set in the imaging device 4 is extracted from the plurality of midpoint positions calculated in step S5.

In step S7, the amount of the position displacement between the midpoint position extracted in step S6 and the target position T set in the imaging device 4 is calculated.

In step S8, the alignment mechanism drive controller 23 controls the drive of the motor of the alignment mechanism 21 to move the mask stage 3 integrally with the imaging device 4 in the direction perpendicular to the substrate conveying direction so that the amount of the position displacement calculated in step S7 is a predetermined value such as, for example, zero to perform alignment between the mask patterns 16 of the photomask 11 and the pixels 7 of the color filter substrate 8.

In addition, the above steps S1 to S8 are performed continuously even while the color filter substrate 8 moves, and exposure is performed with the photomask 11 aligned to the color filter substrate 8 being conveyed. Therefore, even if the color filter substrate 8 is conveyed swaying right and left, the exposure can be performed with the photomask 11 automatically following the movement of the color filter substrate 8, thereby enabling an enhancement of the accuracy in superimposed exposure.

In this case, in the above step S4, immediately after the plurality of correlation value data exceeding the predetermined threshold value are obtained, in other words, the pixels 7 are detected, preferably an arithmetic processing of the moving distance of the color filter substrate 8 is started on the basis of the output from the position sensor, which is not illustrated, provided in the conveying device 1, and then when the color filter substrate 8 moves by a certain distance and the pixels 7 on the front side in the substrate conveying direction reach just under the mask patterns 16 of the photomask 11, the exposure light source 12 lights for only a certain time period. This enables the photomask 11 to be irradiated with the light source light L1 for only a certain time period to expose the color resists on the pixels 7 of the color filter substrate 8.

Figure 7:
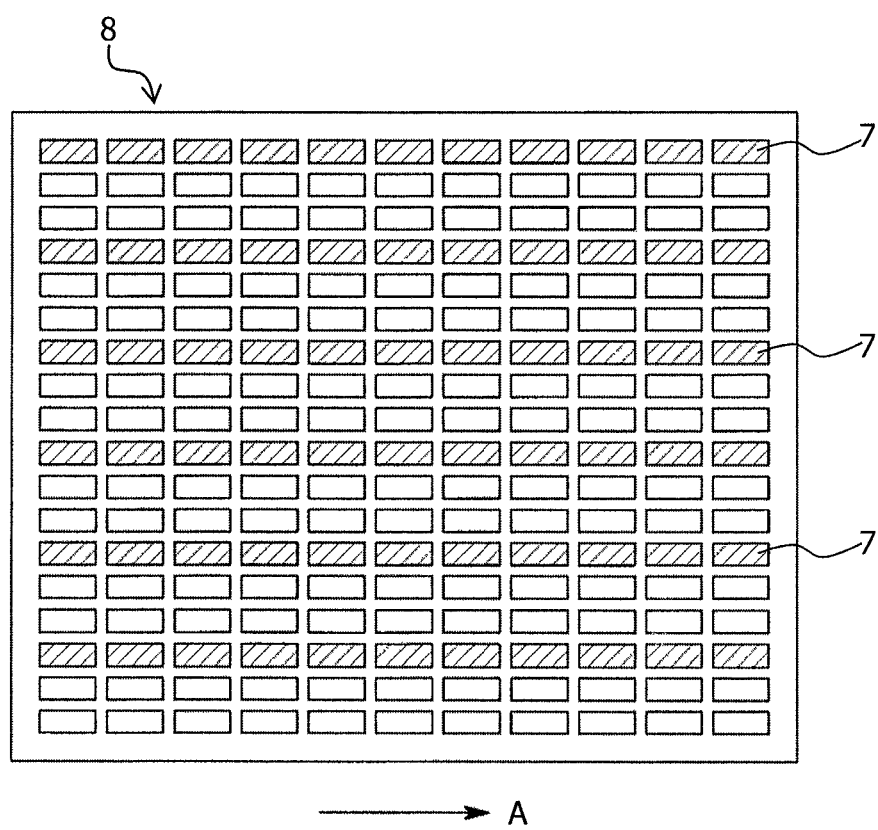
FIG. 7 is an explanatory diagram illustrating an example of exposure on the aforementioned color filter substrate.

Afterward, exposure is performed with the exposure light source 12 lit for only a certain time period every time the color filter substrate 8 moves by a distance equal to the arrangement pitch of the pixels 7 in the substrate conveying direction (the arrow A direction) illustrated in FIG. 2. Alternatively, the irradiation timing of the light source light L1 may be controlled with reference to the detection timing of each pixel 7. This enables color resists having corresponding colors to be formed by exposure on target pixels 7 of the color filter substrate 8, respectively, as illustrated by the shaded areas in FIG. 7.

In the above-described embodiment, there is explained a case of obtaining the averaged correlation value data by averaging the proximity pairs in the first and second correlation value data and then identifying the positions of the plurality of pixels 7 based on the correlation value data exceeding the predetermined threshold value in the averaged correlation value data, however, the present invention is not limited thereto, but the positions of the plurality of pixels 7 may be identified based on the plurality of correlation value data exceeding the predetermined threshold value in the first or second correlation value data.

Moreover, in the above-described embodiment, there is explained a case of calculating the midpoint positions of the plurality of proximity pairs in the plurality of pixels 7 of which positions are identified, selecting the midpoint position close to the target position T preset in the imaging device 4 from the plurality of midpoint positions of the proximity pairs, and calculating the amount of the position displacement between the selected midpoint position and the target position T of the imaging device 4, however, the present invention is not limited thereto, but the position of the pixel 7 close to the target position T preset in the imaging device 4 may be selected from the identified positions of the plurality of pixels 7 to calculate the amount of the position displacement between the selected position of the pixel 7 and the target position T of the imaging device 4.

Furthermore, in the above-described embodiment, there is explained a case in which the alignment apparatus 6 moves the mask stage 3 integrally with the imaging device 4 in the direction perpendicular to the substrate conveying direction, however, the present invention is not limited thereto, but only the mask stage 3 may be moved. In this case, as long as the moving distance of the mask stage 3 is enabled to be measured by a linear scale or the like, the mask stage 3 may be moved by a distance equal to the amount of the position displacement between the selected midpoint position of the color filter substrate 8 and the target position T of the imaging device 4. Alternatively, the alignment apparatus 6 may be an apparatus which moves the color filter substrate 8 in the direction perpendicular to the substrate conveying direction.

Still further, in the above-described embodiment, there is explained a case in which the object to be exposed is the color filter substrate 8 with patterns (pixels 7) each having a relatively simple shape formed on the surface, however, the present invention is not limited thereto, but the object to be exposed may be one with patterns having any shape. For example, the object to be exposed may be a TFT substrate having a complex wiring pattern within the pixel 7. In addition, particularly in the object to be exposed with the patterns having the complex shape as described above, the features of the present invention are effectively exerted.

Moreover, in the above-described embodiment, there is explained a case in which the illumination is an epi-illumination, however, the present invention is not limited thereto, but the illumination may be a transillumination in which light passes through the object to be exposed.

It should be noted that the entire contents of Japanese Patent Application No. 2009-153870, filed on Jun. 29, 2009, on which the convention priority is claimed is incorporated herein by reference.

It should be also understood that many modifications and variations of the described embodiments of the invention will occur to a person having an ordinary skill in the art without departing from the spirit and scope of the present invention as claimed in the appended claims.

What is claimed is:

1. An alignment method for aligning a photomask with an object to be exposed with uniform patterns arranged in a matrix and being conveyed in a direction, the alignment method comprising the steps of:
   detecting positions of brightness changes in an arrangement direction of a plurality of light receiving elements by sequentially processing a plurality of images captured at regular time intervals by an imaging device having a plurality of light receiving elements arranged in a straight line in a direction perpendicular to a conveying direction of the object to be exposed;
   obtaining a plurality of edge count data arranged corresponding to the detected positions of the brightness changes by adding up, in the conveying direction of the object to be exposed, the number of brightness changes detected at the same position in the arrangement direction of the light receiving elements while the object to be exposed moves by a certain distance;
   obtaining a plurality of correlation value data by performing a correlation operation for the plurality of calculated edge count data while moving a template, on which a unit edge count data is preset for a pattern having the same shape as the pattern, from one end toward the other end in the arrangement direction of the plurality of calculated edge count data;
   identifying the positions of the plurality of patterns based on a plurality of correlation value data exceeding a predetermined threshold value in the plurality of correlation value data;
   selecting the position of the closest pattern to a target position preset in the imaging device from the identified positions of the plurality of patterns;
   calculating the amount of a position displacement between the selected position of the pattern and the target position of the imaging device; and
   relatively moving at least the photomask in the direction perpendicular to the conveying direction of the object to be exposed so that the amount of the position displacement is a predetermined value to perform alignment between the photomask and the object to be exposed.

2. The alignment method according to claim 1, further comprising the steps of: after identifying the positions of the plurality of patterns, calculating midpoint positions of proximity pairs of the plurality of patterns; and selecting the closest midpoint position to the target position preset in the imaging device from the plurality of midpoint positions, instead of comprising the step of selecting the position of the closest pattern to the target position preset in the imaging device,
   wherein in the step of calculating the amount of the position displacement, the amount of a position displacement between the selected midpoint position and the target position of the imaging device is calculated.

3. The alignment method according to claim 1, wherein:
   in the step of detecting the positions of brightness changes, the positions of brightness changes from light to dark and dark to light are detected;
   in the step of obtaining the plurality of edge count data, respective edge count data is obtained by adding up the number of brightness changes from light to dark and dark to light respectively;
   in the step of obtaining the plurality of correlation value data, a plurality of correlation value data corresponding to the brightness changes from light to dark and a plurality of correlation value data corresponding to the brightness changes from dark to light are found by performing a correlation operation for the calculated respective edge count data, and then, an averaged correlation value data is obtained by averaging the proximity pairs in the plurality of correlation value data; and in the step of identifying the positions of the plurality of patterns, the positions of the plurality of patterns identified based on the plurality of averaged correlation value data exceeding the predetermined threshold value in the averaged correlation value data.

4. The alignment method according to claim 1, wherein the imaging device captures an image of the patterns of the object to be exposed under epi-illumination.

5. The alignment method according to claim 1, wherein the object to be exposed is a TFT substrate on which a wiring pattern is formed.

6. An alignment apparatus for aligning a photomask with an object to be exposed with uniform patterns arranged in a matrix and being conveyed in a direction, the alignment apparatus comprising:

an image processing section which detects positions of brightness changes in an arrangement direction of a plurality of light receiving elements by sequentially processing a plurality of images captured at regular time intervals by imaging device having the light receiving elements arranged in a straight line in a direction perpendicular to a conveying direction of the object to be exposed, adds up, in the conveying direction of the object to be exposed, the number of brightness changes detected at the same position in the arrangement direction of the light receiving elements while the object to be exposed moves by a certain distance, obtains a plurality of edge count data arranged corresponding to the detected positions of the brightness changes, obtains a plurality of correlation value data by performing a correlation operation for the plurality of calculated edge count data while moving a template, on which a unit edge count data is preset for a pattern having the same shape as the pattern, from one end toward the other end in the arrangement direction of the plurality of calculated edge count data, and identifies the positions of the plurality of patterns based on a plurality of correlation value data exceeding a predetermined threshold value in the plurality of correlation value data;

an arithmetic section which selects a position of the closest pattern to a target position preset in the imaging device from the identified positions of the plurality of patterns and calculates the amount of a position displacement between the selected position of the pattern and the target position of the imaging device; and an alignment apparatus which relatively moves at least the photomask in the direction perpendicular to the conveying direction of the object to be exposed so that the amount of the position displacement is a predetermined value to perform alignment between the photomask and the object to be exposed.

7. The alignment apparatus according to claim 6, wherein the arithmetic section calculates midpoint positions of proximity pairs of the plurality of identified patterns, selects the closest midpoint position to the target position preset in the imaging device from the plurality of midpoint positions, and calculates the amount of a position displacement between the selected midpoint position and the target position of the imaging device.

8. The alignment apparatus according to claim 6, wherein the image processing section detects the positions of brightness changes from light to dark and dark to light, obtains respective edge count data by adding up the number of brightness changes from light to dark and dark to light respectively, finds a plurality of correlation value data corresponding to the brightness changes from light to dark and a plurality of correlation value data corresponding to the brightness changes from dark to light by performing a correlation operation for the calculated respective edge count data, obtains an averaged correlation value data by averaging the proximity pairs in the plurality of correlation value data, and then identifies the positions of the plurality of patterns based on the plurality of averaged correlation value data exceeding the predetermined threshold value in the averaged correlation value data.

9. An exposure apparatus for exposing an object to be exposed with uniform patterns arranged in a matrix and being conveyed in a direction with a photomask aligned with the object to be exposed, the exposure apparatus comprising:

a light source which emits an ultraviolet light;

a mask stage which holds the photomask so as to be opposite to and close to a surface of the object to be exposed being conveyed;

an imaging device which has a plurality of light receiving elements arranged in a straight line in a direction perpendicular to a conveying direction of the object to be exposed and captures an image of the object at a position spaced apart a certain distance in the opposite direction of the conveying direction of the exposure position with the photomask; and an alignment apparatus which detects positions of brightness changes in an arrangement direction of the light receiving elements by sequentially processing a plurality of images captured at regular time intervals by the imaging device, adds up, in the conveying direction of the object to be exposed, the number of brightness changes detected at the same position in the arrangement direction of the light receiving elements while the object to be exposed moves by a certain distance, obtains a plurality of edge count data arranged corresponding to the detected positions of the brightness changes, obtains a plurality of correlation value data by performing a correlation operation for the plurality of calculated edge count data while moving a template, on which a unit edge count data is preset for a pattern having the same shape as the pattern, from one end toward the other end in the arrangement direction of the plurality of calculated edge count data, and identifies the positions of the plurality of patterns based on a plurality of correlation value data exceeding a predetermined threshold value in the plurality of correlation value data, selects a position of the closest pattern to a target position preset in the imaging device from the identified positions of the plurality of patterns, calculates the amount of a position displacement between the selected position of the pattern and the target position of the imaging device, and relatively moves at least the mask stage in the direction perpendicular to the conveying direction of the object to be exposed so that the amount of the position displacement is a predetermined value to perform alignment between the photomask and the object to be exposed.

10. The exposure apparatus according to claim 9, wherein the alignment apparatus identifies the positions of the plurality of patterns, calculates midpoint positions of proximity pairs of the plurality of patterns, selects the closest midpoint position close to the target position preset in the imaging means from the plurality of midpoint positions, and calculates the amount of a position displacement between the selected midpoint position and the target position of the imaging means.

11. The exposure apparatus according to claim 9, wherein the alignment apparatus detects positions of brightness changes from light to dark and dark to light, obtains respective edge count data by adding up the number of brightness changes from light to dark and dark to light respectively, finds a plurality of correlation value data corresponding to the brightness changes from light to dark and a plurality of correlation value data corresponding to the brightness changes from dark to light by performing a correlation operation for the calculated respective edge count data, obtains an averaged correlation value data by averaging the proximity pairs in the plurality of correlation value data, and then identifies the positions of the plurality of patterns based on the plurality of averaged correlation value data exceeding the predetermined threshold value in the averaged correlation value data.

* * * * *

UNITED STATES PATENT AND TRADEMARK OFFICE
CERTIFICATE OF CORRECTION

| | |
|---|---|
| PATENT NO. | : 9,069,266 B2 |
| APPLICATION NO. | : 13/339118 |
| DATED | : June 30, 2015 |
| INVENTOR(S) | : Takamitsu Iwamoto |

It is certified that error appears in the above-identified patent and that said Letters Patent is hereby corrected as shown below:

In the Claims

In claim 10, column 16, line 63, "position close to the target position" should read --position to the target position--.

Signed and Sealed this
Twelfth Day of April, 2016

Michelle K. Lee
*Director of the United States Patent and Trademark Office*